(12) United States Patent
Ballantyne et al.

(10) Patent No.: US 8,045,669 B2
(45) Date of Patent: Oct. 25, 2011

(54) DIGITAL PHASE-LOCKED LOOP OPERATING BASED ON FRACTIONAL INPUT AND OUTPUT PHASES

(75) Inventors: Gary John Ballantyne, Christchurch (NZ); Bo Sun, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 892 days.

(21) Appl. No.: 11/947,587

(22) Filed: Nov. 29, 2007

(65) Prior Publication Data

US 2009/0141845 A1 Jun. 4, 2009

(51) Int. Cl.
*H03D 3/04* (2006.01)
(52) U.S. Cl. ........................................... 375/376
(58) Field of Classification Search .......... 375/371, 375/373, 376; 331/18, 25; 327/2, 3, 7
See application file for complete search history.

(56) References Cited

U.S. PATENT DOCUMENTS

| | | | |
|---|---|---|---|
| 5,166,642 A * | 11/1992 | Hietala | 331/1 A |
| 6,107,890 A * | 8/2000 | Carson et al. | 331/17 |
| 6,232,952 B1 | 5/2001 | Eglit | |
| 6,909,331 B2 | 6/2005 | Ballantyne | |
| 7,023,282 B1 * | 4/2006 | Humpreys et al. | 331/1 A |
| 7,250,823 B2 * | 7/2007 | Shields | 331/16 |
| 7,274,229 B1 * | 9/2007 | Humphreys et al. | 327/156 |
| 7,279,988 B1 | 10/2007 | Janesch et al. | |
| 7,532,679 B2 * | 5/2009 | Staszewski et al. | 375/295 |
| 2002/0136341 A1 * | 9/2002 | Huh et al. | 375/376 |
| 2002/0191727 A1 * | 12/2002 | Staszewski et al. | 375/376 |
| 2008/0150642 A1 * | 6/2008 | Partridge et al. | 331/66 |

FOREIGN PATENT DOCUMENTS

| | | |
|---|---|---|
| EP | 1261134 A2 | 11/2002 |
| EP | 1816741 A1 | 8/2007 |

OTHER PUBLICATIONS

Staszewski et al., Phase-Domain All-Digital Phase-Locked Loop, Mar. 2005, IEEE Transactions on Circuits and Systems, vol. 52, No. 53, pp. 159-163.*
Kratyuk et al., A Digital PLL With a Stochastic Time-To-Digital Converter, 2006, 2006 Symposium on VLSI Circuits Digest of Technical Papers, pp. 1-2.*

(Continued)

*Primary Examiner* — Tesfaldet Bocure
*Assistant Examiner* — Lawrence B Williams
(74) *Attorney, Agent, or Firm* — Larry Moskowitz

(57) ABSTRACT

In one aspect, a digital PLL (DPLL) operates based on fractional portions of input and output phases. The DPLL accumulates at least one input signal to obtain an input phase. The DPLL determines a fractional portion of an output phase based on a phase difference between an oscillator signal from an oscillator and a reference signal, e.g., using a time-to-digital converter (TDC). The DPLL determines a phase error based on the fractional portion of the input phase and the fractional portion of the output phase. The DPLL then generates a control signal for the oscillator based on the phase error. In another aspect, a DPLL includes a synthesized accumulator that determines a coarse output phase by keeping track of the number of oscillator signal cycles based on the reference signal.

27 Claims, 10 Drawing Sheets

OTHER PUBLICATIONS

Pierce, W, A Novel Approach to Digitally Controlled Phase Locked Loop Tuning Systems, 1982, Consumer Electronics, IEEE Transactions on, vol. CE-28, Issue: 3, pp. 214-219.*

Abramovitch, D., Efficient and Flexible Simulation of Phase Locked Loop, Part II: Post Processing and a Design Example, 2008, American Control Conference, pp. 4678-4683.*

Staszewski, "Digitally-Intensive Transceiver for GSM/EDGE," Jun. 7, 2005, Texas Instruments.

International Search Report and Written Opinion—PCT/US2008/085084, International Search Authority—European Patent Office—Nov. 20, 2009.

* cited by examiner

DIGITAL PHASE-LOCKED LOOP OPERATING BASED ON FRACTIONAL INPUT AND OUTPUT PHASES

BACKGROUND

I. Field

The present disclosure relates generally to electronics, and more specifically to a digital phase-locked loop.

II. Background

Phase-locked loops (PLLs) are an integral part of many electronics circuits and are particularly important in communication circuits. For example, digital circuits use clock signals to trigger synchronous circuits, e.g., flip-flops. Transmitters and receivers use local oscillator (LO) signals for frequency upconversion and downconversion, respectively. Wireless devices (e.g., cellular phones) for wireless communication systems typically use clock signals for digital circuits and LO signals for transmitters and receivers. The clock and LO signals are generated with oscillators and their frequencies are often controlled with PLLs.

A PLL typically includes various circuit blocks used to adjust the frequency and/or phase of an oscillator signal from an oscillator. These circuit blocks may consume a relatively large amount of power, which may be undesirable for portable devices such as cellular phones. There is therefore a need in the art for techniques to reduce power consumption of a PLL without sacrificing performance.

SUMMARY

A digital PLL (DPLL) having good performance and lower power consumption is described herein. A DPLL is a PLL with circuit blocks implemented digitally rather than with analog circuits. The digital implementation may provide certain advantages such as lower cost, less circuit area, etc.

In one aspect, a DPLL may operate based on fractional portions of input and output phases. The DPLL may accumulate at least one input signal, which may include a modulating signal, to obtain an input phase. The DPLL may determine a fractional portion of an output phase based on a phase difference between an oscillator signal from an oscillator and a reference signal, e.g., using a time-to-digital converter (TDC). The DPLL may then determine a phase error based on the fractional portion of the input phase and the fractional portion of the output phase. The fractional portion may have a range of one cycle of the oscillator signal. In one design, the DPLL may determine a phase difference between the fractional portion of the output phase and the fractional portion of the input phase. The DPLL may then add a predetermined value (e.g., one oscillator cycle) to or subtract the predetermined value from the phase difference, if needed, so that the resultant phase error is within a predetermined range (e.g., from minus one half oscillator cycle to plus one half oscillator cycle). The DPLL may generate a control signal for the oscillator based on the phase error.

In another aspect, a DPLL may include a synthesized accumulator and a TDC. The synthesized accumulator may determine a coarse output phase by keeping track of the number of cycles of an oscillator signal. The synthesized accumulator may be updated based on a reference signal having a frequency that is lower than the frequency of the oscillator signal. The TDC may determine a fine output phase based on a phase difference between the oscillator signal and the reference signal. The DPLL may generate a control signal for the oscillator based on the coarse output phase, the fine output phase, and the input phase.

Various aspects and features of the disclosure are described in further detail below.

DETAILED DESCRIPTION

Figure 1:
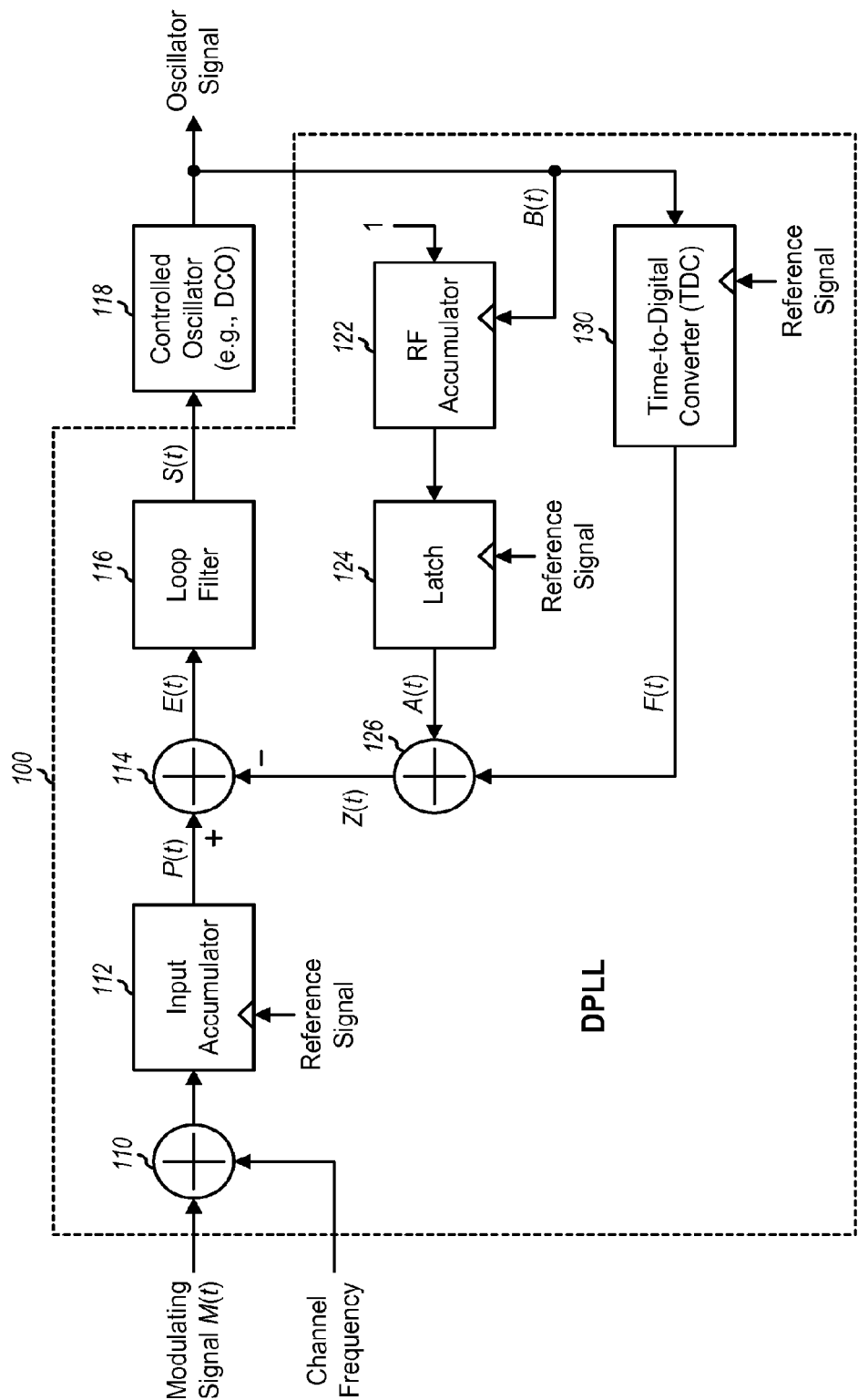
FIG. 1 shows a block diagram of a DPLL.

FIG. 1 shows a block diagram of a design of a DPLL 100. Within DPLL 100, a summer 110 receives and sums a modulating signal M(t) with a static value for a center frequency of a frequency channel used for communication. An input accumulator 112 accumulates the output of summer 110 and provides an input phase P(t). The accumulation essentially converts frequency to phase. Input accumulator 112 is triggered by a reference signal, which may have a fixed frequency of $f_{ref}$. Various circuit blocks and signals within DPLL 100 are also updated with the reference signal, and t is an index for the reference signal.

A radio frequency (RF) accumulator 122 increments by one for each oscillator cycle, which is one cycle of an oscillator signal from a controlled oscillator 118. A latch 124 latches the output of RF accumulator 122 when triggered by the reference signal and provides a coarse/integer output phase A(t). A TDC 130 receives the oscillator signal and the reference signal, determines the phase of the oscillator signal when triggered by the reference signal, and provides a TDC output F(t) that indicates the fine/fractional phase difference between the oscillator signal and the reference signal. TDC 130 implements a fractional phase sensor for DPLL 100. A summer 126 receives and sums the coarse output phase A(t) and the TDC output F(t) and provides a feedback phase Z(t), which is an estimate of an output phase B(t).

A summer 114 receives and subtracts the feedback phase Z(t) from the input phase P(t) and provides a phase error E(t). A loop filter 116 filters the phase error and provides a control signal S(t) for oscillator 118. Loop filter 116 sets the loop dynamics of DPLL 100. The control signal adjusts the frequency of oscillator 118 such that the phase of the oscillator signal follows the phase of the modulation. The control signal may have any suitable number of bits of resolution, e.g., 8, 12, 16, 20, 24, or more bits of resolution.

Oscillator 118 may be a digitally controlled oscillator (DCO), a voltage controlled oscillator (VCO), a current controlled oscillator (ICO), or some other type of oscillator whose frequency can be adjusted by a control signal. Oscillator 118 may operate at a nominal frequency of $f_{osc}$, which may be determined by the application for which DPLL 100 is used. For example, DPLL 100 may be used for a wireless communication device, and $f_{osc}$ may be hundreds of megahertz (MHz) or few gigahertz (GHz). The reference signal may be generated based on a crystal oscillator (XO), a voltage controlled crystal oscillator (VCXO), a temperature compensated crystal oscillator (TCXO), or some other type of oscillator having an accurate frequency. The frequency of the reference signal may be much lower than the frequency of the oscillator signal. For example, $f_{ref}$ may be tens of MHz whereas $f_{osc}$ may be several GHz.

The input phase P(t), the output phase B(t), and the feedback phase Z(t) may be given in units of oscillator cycle. In the design shown in FIG. 1, the feedback path of DPLL 100 includes (i) RF accumulator 122 to measure the coarse output phase, which is given in integer number of oscillator cycles, and (ii) TDC 130 to measure the fine output phase, which is given by a fraction of one oscillator cycle. The combination of RF accumulator 122 and TDC 130 measures the total output phase B(t), which includes the coarse/integer portion from RF accumulator 122 and the fine/fractional portion from TDC 130. In the description herein, the terms "fine" and "fractional" are used interchangeably, and the terms "coarse" and "integer" are also used interchangeably. The feedback phase Z(t), which is an estimate of the output phase, is subtracted from the input phase to obtain the phase error for loop filter 116.

All of the blocks in DPLL 100, except for RF accumulator 122, may be operated based on the reference signal. RF accumulator 122 operates based on the oscillator signal, which may be many times higher in frequency than the reference signal. Consequently, RF accumulator 122 may be responsible for a large fraction (e.g., around 50%) of the total power consumption of DPLL 100. Hence, it may be desirable to operate DPLL 100 with RF accumulator 122 turned off in order to conserve battery power.

In one reference cycle, which is one cycle of the reference signal, the total output phase $\theta_{total}$ may be given as:

$$\theta_{total} = 2\pi \cdot f_{osc}/f_{ref} \text{ radians.} \qquad \text{Eq (1)}$$

The total output phase may be given in units of oscillator cycle and may be partitioned into an integer portion $\theta_{int}$ and a fractional portion $\theta_{frac}$. The integer portion $\theta_{int}$ may be given in integer number of oscillator cycles or integer multiple of $2\pi$ radians. The fractional portion $\theta_{frac}$ may be given by a fraction of one oscillator cycle or within a range of 0 to $2\pi$ radians. The integer portion $\theta_{int}$ and the fractional portion $\theta_{frac}$ may be given as follows:

$$\theta_{int} = 2\pi \cdot \lfloor f_{osc}/f_{ref} \rfloor, \text{ and} \qquad \text{Eq (2)}$$

$$\theta_{frac} = \theta_{total} - \theta_{int}, \qquad \text{Eq (3)}$$

where "$\lfloor \ \rfloor$" denotes a floor operator.

RF accumulator 122 may determine the integer portion of the output phase by determining the number of oscillator cycles within one reference cycle. TDC 130 may determine the fractional portion of the output phase by comparing the phase of the oscillator signal against the phase of the reference signal.

Figure 2:
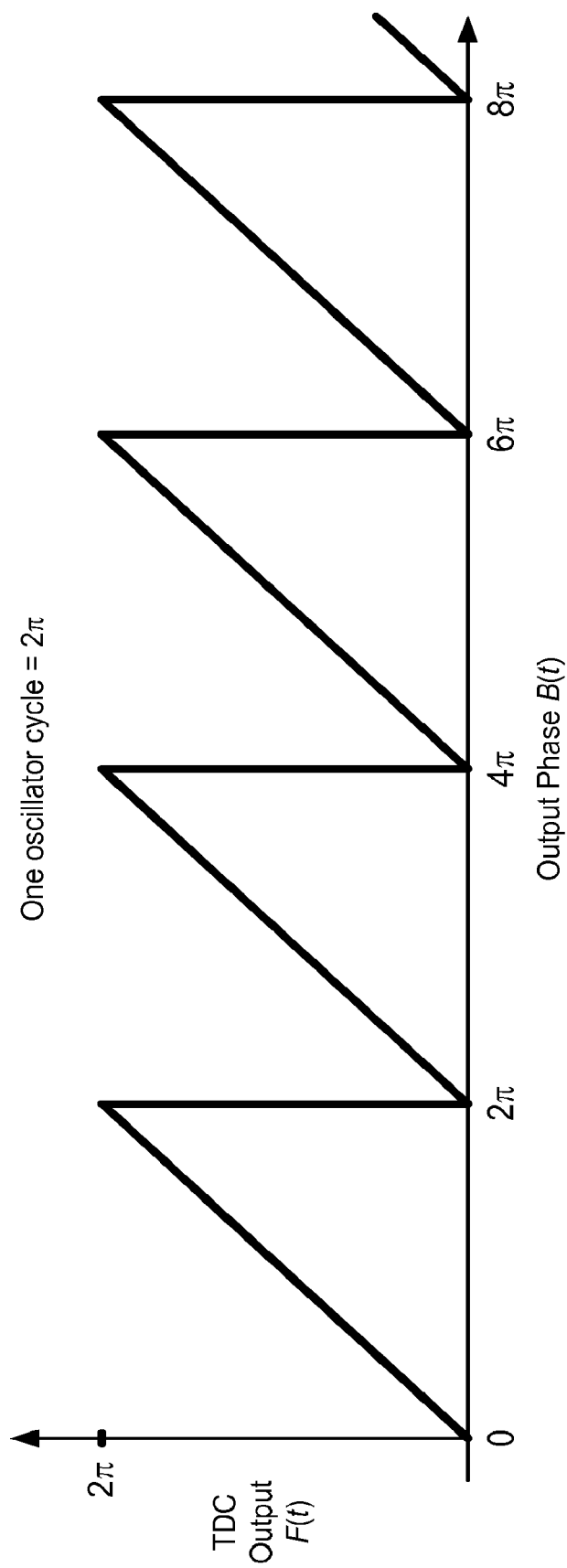
FIG. 2 shows a plot of output versus input for a TDC.

FIG. 2 shows a plot of output versus input for TDC 130. The horizontal axis shows the output phase B(t), which is the input to TDC 130. The vertical axis shows TDC output F(t). For both the horizontal and vertical axes, one oscillator cycle is equal to $2\pi$. As shown in FIG. 2, TDC 130 has a discontinuous output versus input. The TDC output F(t) is equal to the output phase B(t) from 0 to $2\pi$, then wraps around to 0 when B(t)=$2\pi$, then increases linearly with B(t) from $2\pi$ to $4\pi$, then wraps around to 0 when B(t)=$4\pi$, and so on.

The discontinuities in the TDC output should be addressed in order for the DPLL to operate properly. One way of addressing these discontinuities is to use RF accumulator 122 to keep track of the number of times that the output phase B(t) exceeds $2\pi$. The output of RF accumulator 122, in integer multiple of $2\pi$, may then be added to the TDC output in order to limit the range of operation from 0 to $2\pi$ to avoid the discontinuity. However, RF accumulator 122 may consume much current because of its high operating frequency.

As shown in FIG. 2, the TDC output jumps every $2\pi$ but is continuous over a range of $2\pi$ between successive phase jumps. If the rate of change of the output phase is limited, then the phase jumps in the TDC output may be identified as they occur and accounted for. For example, DPLL 100 may be unmodulated so that M(t)=0, and P(t) has no fractional part for all t. The initial condition may be F(0)=0 and A(0)=P(0) so that E(0)=0. Since the DPLL is locked, the control signal S(t) may have a constant value. If the output phase increases slightly (e.g., by 0.1 radians), then TDC 130 will measure this phase and provide a compensating signal (e.g., E(t)=−0.1 radians). However, if the output phase B(t) decreases slightly (e.g., by −0.1 radians), then TDC 130 will output a large value (e.g., $2\pi$−0.1 radians). The phase error will then be off by one oscillator cycle, which may adversely impact the performance of the DPLL.

However, if the rate of change of the output phase is limited, then any large change in the TDC output within one reference cycle may be attributed to a phase jump. One oscillator cycle may then be added to or subtracted from the TDC output to obtain the correct phase value. In the example above, a large value of $2\pi$−0.1 radians for the TDC output may be attributed to a phase jump, $2\pi$ may be subtracted from this value, and −0.1 radians may be provided as the correct TDC output value.

In an aspect, a DPLL is operated based on the fractional output phase from a TDC and the fractional portion of the input phase, without using an RF accumulator. In each reference cycle, the TDC output may be subtracted from the fractional portion of the input phase, as follows:

$$D(t) = P_f(t) - F(t), \qquad \text{Eq (4)}$$

where $P_f(t)$ is the fractional portion of the input phase and ranges from 0 to $2\pi$, and D(t) is the difference between the fractional portion of the input phase and the TDC output, which is the fractional portion of the output phase.

The rate of change of the input phase and the rate of change of the output phase may be assumed to be limited, and the phase error may be assumed to be within a range of −$\pi$ to $\pi$ in each reference cycle. The phase error may then be determined as follows:

$$E(t) = \begin{cases} D(t) & \text{if } -\pi < D(t) \leq \pi \\ D(t) + 2\pi & \text{if } D(t) \leq -\pi \\ D(t) - 2\pi & \text{if } D(t) > \pi. \end{cases} \qquad \text{Eq (5)}$$

Equation (5) shows a design in which D(t) is compared against thresholds of +$\pi$ and −$\pi$. D(t) may also be compared against other thresholds.

As shown in equation (5), if the phase difference is larger than $\pi$ or smaller than −$\pi$, then a phase jump is assumed to have occurred. In this case, $2\pi$ may be either added to or subtracted from the phase difference so that the resultant phase error is closer to zero.

Figure 3:
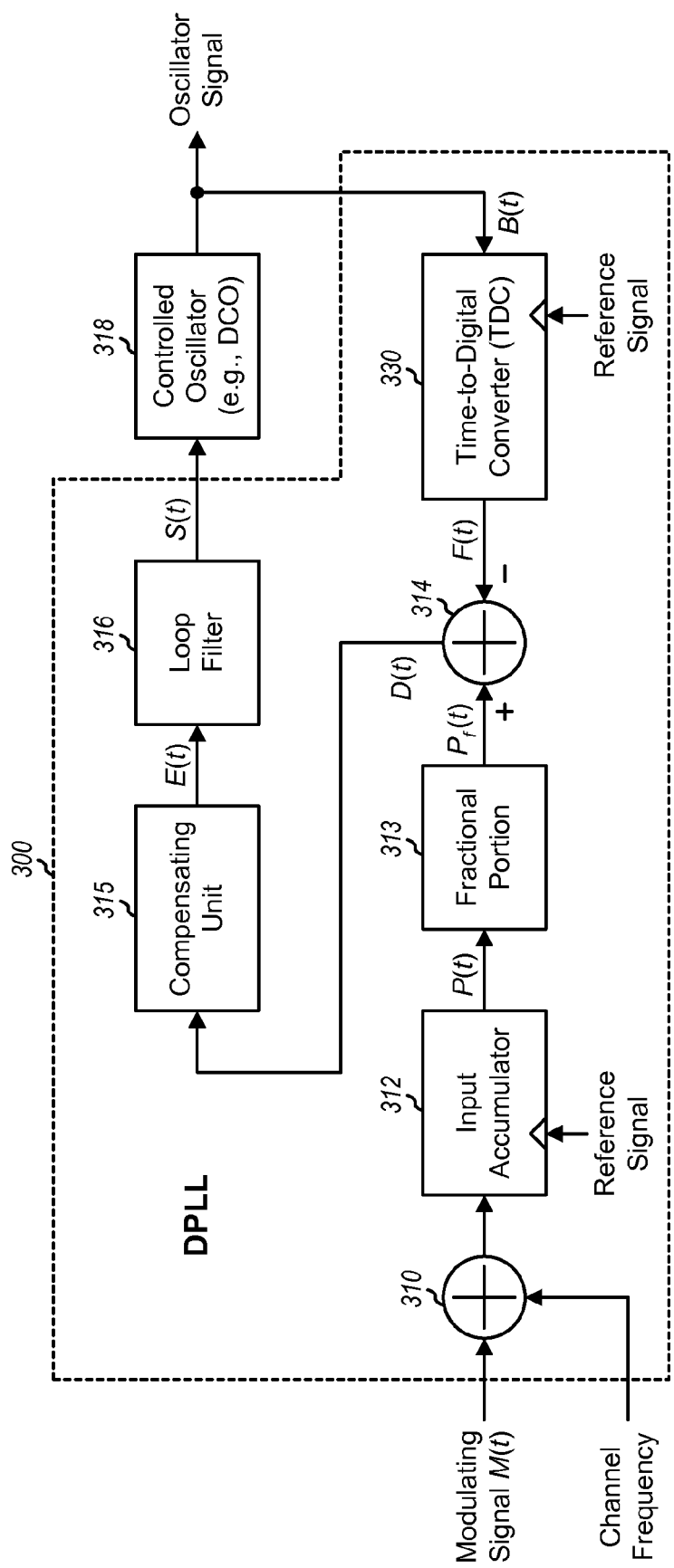
FIG. 3 shows a block diagram of a DPLL operating based on fractional input and output phases.

FIG. 3 shows a block diagram of a design of a DPLL 300 operating based solely on the fractional portions of the input phase and the output phase. Within DPLL 300, a summer 310 and an input accumulator 312 operate as described above for summer 110 and input accumulator 112 in FIG. 1 and provide the input phase P(t). A unit 313 receives the input phase and provides the fractional portion $P_f(t)$. A TDC 330 receives an oscillator signal from a controlled oscillator 318 and a reference signal and provides a TDC output F(t) that indicates the fine/fractional phase difference between the oscillator signal and the reference signal. A summer 314 subtracts the TDC output F(t) from the fractional input phase $P_f(t)$ and provides a phase difference D(t). A unit 315 receives the phase difference and determines a phase error E(t), e.g., as shown in equation (5). A loop filter 316 filters the phase error and provides a control signal S(t) for oscillator 318.

In one design, an RF accumulator may be used initially to lock oscillator 318 to the modulating signal. A lock detector (not shown in FIG. 3) may determine whether DPLL 300 has locked, e.g., by observing the magnitude of the phase error. After DPLL 300 has locked, the RF accumulator may be disabled, and only the fractional portions of the input phase and output phase may be used to operate the DPLL.

In another aspect, a synthesized accumulator may be used to determine the coarse/integer output phase. The synthesized accumulator may operate based on the reference signal instead of the oscillator signal and may thus consume much less power than an RF accumulator.

Figure 4:
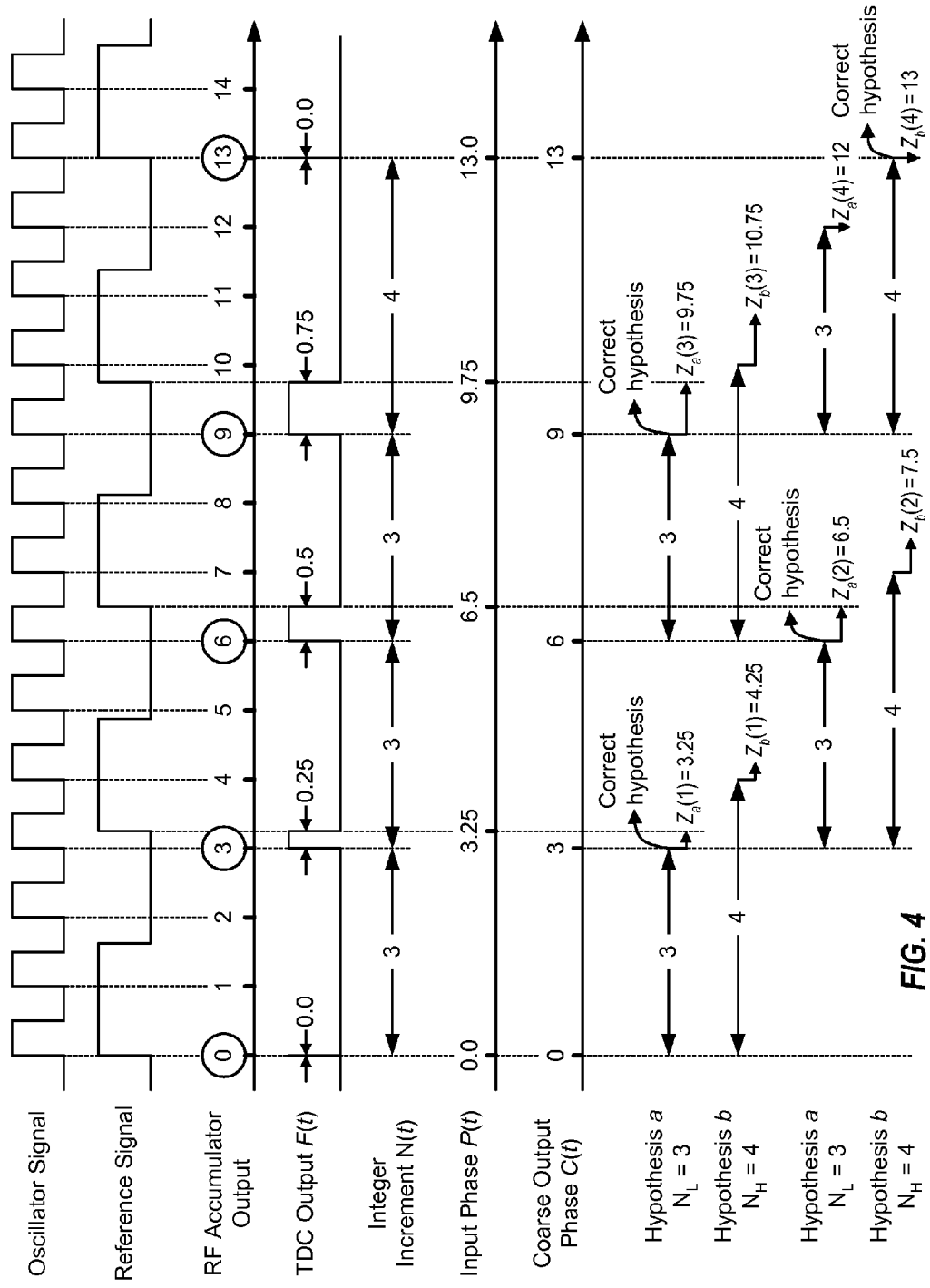
FIG. 4 shows operation of a synthesized accumulator.

FIG. 4 illustrates the operation of a DPLL with a synthesized accumulator. In the example shown in FIG. 4, the frequency of the oscillator signal is 3.25 times the frequency of the reference signal, and a frequency control word (FCW) of 3.25 may be provided as the channel frequency in FIG. 1. For simplicity, the DPLL is assumed to be locked and triggered based on the rising edges of the oscillator signal and the reference signal.

The oscillator signal is shown in the first line at the top of FIG. 4, and the reference signal is shown in the second line. The output of an RF accumulator is shown in the third line. The RF accumulator increments by one on each rising edge of the oscillator signal and thus keeps track of the oscillator cycles as they occur. The output of the RF accumulator is latched at each rising edge of the reference signal, and each latched value is shown within a circle in the third line. Each latched value is obtained by rounding down the number of oscillator cycles to the nearest integer value. For example, there are 3.25 oscillator cycles between the first and second rising edges of the reference signal in FIG. 4, and the RF accumulator output is 3, which is equal to 3.25 rounded down. In the example shown in FIG. 4, there are 3.25 oscillator cycles per reference cycle, and the latched values are 0, 3, 6, 9, 13, etc.

The output of an ideal TDC is shown in the fourth line. The TDC measures the fractional portion of the output phase, which was overlooked by the rounding down function. The fractional portion is equal to the difference between the rising edge of the reference signal and the nearest preceding rising edge of the oscillator signal. The TDC provides a fractional value between 0 and 1.0 for each rising edge of the reference signal. As shown in FIG. 4, the output of the TDC is periodic. The feedback phase may be obtained by adding the fine/fractional portion from the TDC and the coarse/integer portion from the RF accumulator.

The rounded number of oscillator cycles per reference cycle, which is also referred to as an integer increment N(t), is shown in the fifth line. For each rising edge of the reference signal, N(t) is equal to the difference between the current latched value and the prior latched value. In the example shown in FIG. 4, N(t) is a sequence of 3, 3, 3, 4, 3, 3, 3, 4, 3, etc. N(t) has an average value of 3.25 and is periodic in the same manner as the TDC output. Furthermore, N(t) has only two possible integer values, which are 3 and 4 in the example shown in FIG. 4, after the DPLL has locked. This toggling between two integer values is true even when the DPLL is applied with narrowband frequency modulation. To toggle between three integer values, the frequency modulation would need to be greater than the reference frequency $f_{ref}$, so that one additional full oscillator cycle can fit within a reference cycle. Typically, the peak modulation frequency is a fraction of the reference frequency. For example, the peak modulation frequency may be few MHz whereas the reference frequency may be tens of MHz. In this case, N(t) has only two possible integer values.

If N(t) can take on only two possible integer values, then it may be possible to determine N(t) without the use of an RF accumulator operating at the oscillator frequency $f_{osc}$. This may be achieved by exploiting the fact that the phase error changes by only a small amount per reference cycle even when the DPLL is modulated. For example, the peak frequency modulation may be approximately 3 MHz for low-band EDGE with a 4 GHz oscillator and four-fold division at the DPLL output, the reference frequency may be approximately 57 MHz, and the maximum change in input phase per reference cycle may be approximately 0.3 radians or about 5% of a reference cycle. Thus, the modulation does not obscure the $2\pi$ phase jumps, and the operation of the DPLL is essentially unchanged.

N(t) may be determined without using an RF accumulator as follows. For each reference cycle or update interval t, the correct value of N(t) may be determined by evaluating two hypotheses for N(t). The first hypothesis a is for the case in which N(t) is the smaller of the two values, which is denoted as $N_L$ and is equal to 3 for the example shown in FIG. 4. The second hypothesis b is for the case in which N(t) is the larger of the two values, which is denoted as $N_H$ and is equal to 4 for the example shown in FIG. 4. The hypothesis that provides a smaller phase error magnitude may be selected, and $N_L$ or $N_H$ for the correct hypothesis may be used to update a register that stores a running count of the number of oscillator cycles. This register provides a coarse output phase C(t), which is given in integer number of oscillator cycles.

The two hypotheses a and b may be evaluated as follows. The register may be initialized, e.g., based on the integer portion of the input phase P(t) after the DPLL has locked. In the example shown in FIG. 4, the register is initialized to zero. At the second rising edge of the reference signal, hypothesis a has a hypothesized output phase of $Z_a(1)=3+0+0.25=3.25$, where 3 is the $N_L$ value for hypothesis a, 0 is the coarse output phase C(1) from the register, and 0.25 is the TDC output value. Hypothesis b has a hypothesized output phase of $Z_b(1)=4+0+0.25=4.25$, where 4 is the $N_H$ value for hypothesis b. The hypothesized output phases $Z_a(1)$ and $Z_b(1)$ for the two hypotheses are compared against the input phase P(1)=3.25. Since $Z_a(1)$ is closer to P(1) than $Z_b(1)$, hypothesis a is the correct hypothesis. The register is then updated by 3, which is the $N_L$ value for the correct hypothesis a, and stores a coarse output phase of 3.

At the third rising edge of the reference signal, hypothesis a has a hypothesized output phase of $Z_a(2)=3+3+0.5=6.5$, where the first 3 is the $N_L$ value for hypothesis a, the second 3 is the coarse output phase C(2) from the register, and 0.5 is the TDC output value. Hypothesis b has a hypothesized output phase of $Z_b(2)=4+3+0.5=7.5$, where 4 is the $N_H$ value for hypothesis b. The hypothesized output phases $Z_a(2)$ and $Z_b(2)$ for the two hypotheses are compared against the input phase P(2)=6.5. Since $Z_a(2)$ is closer to P(2) than $Z_b(2)$, hypothesis a is the correct hypothesis. The register is then updated by 3, which is the $N_L$ value for the correct hypothesis a, and stores a coarse output phase of 6. The same processing may be repeated for each subsequent reference cycle.

In general, the two possible integer values for N(t) may be determined as follows:

$$N_L = \left\lfloor \frac{f_{osc}}{f_{ref}} \right\rfloor \text{ and } N_H = \left\lceil \frac{f_{osc}}{f_{ref}} \right\rceil, \quad \text{Eq (6)}$$

where $N_L$ is the smaller of the two possible integer values for N(t),
$N_H$ is the larger of the two possible integer values for N(t), and
"⌈ ⌉" denotes a ceiling operator.

The hypothesized output phases for hypotheses a and b may be determined as follows:

$$Z_a(t) = N_L + C(t) + F(t), \text{ and} \quad \text{Eq (7)}$$

$$Z_b(t) = N_H + C(t) + F(t), \quad \text{Eq (8)}$$

where

C(t) is the coarse output phase in reference cycle t,
$Z_a(t)$ is the hypothesized output phase for hypothesis a in reference cycle t, and
$Z_b(t)$ is the hypothesized output phase for hypothesis b in reference cycle t.

The hypothesized phase errors for hypotheses a and b may be determined as follows:

$$E_a(t) = P(t) - Z_a(t), \text{ and} \quad \text{Eq (9)}$$

$$E_b(t) = P(t) - Z_b(t), \quad \text{Eq (10)}$$

where $E_a(t)$ is the hypothesized phase error for hypothesis a in reference cycle t, and
$E_b(t)$ is the hypothesized phase error for hypothesis b in reference cycle t.

The coarse output phase may be updated as follows:

$$C(t+1) = \begin{cases} C(t) + N_L & \text{if } |E_a(t)| < |E_b(t)| \\ C(t) + N_H & \text{otherwise.} \end{cases} \quad \text{Eq (11)}$$

The phase error E(t) in reference cycle t may be determined as follows:

$$E(t) = \begin{cases} E_a(t) & \text{if } |E_a(t)| < |E_b(t)| \\ E_b(t) & \text{otherwise.} \end{cases} \quad \text{Eq (12)}$$

The phase error from equation (12) may be provided to the loop filter in the DPLL.

As shown in equations (6) through (12), to choose between two possible integer values of N(t) in a given reference cycle, the two hypotheses a and b may be evaluated. The hypothesis that has a hypothesized output phase closer to the input phase, or equivalently a smaller phase error magnitude, may be selected.

Figure 5:
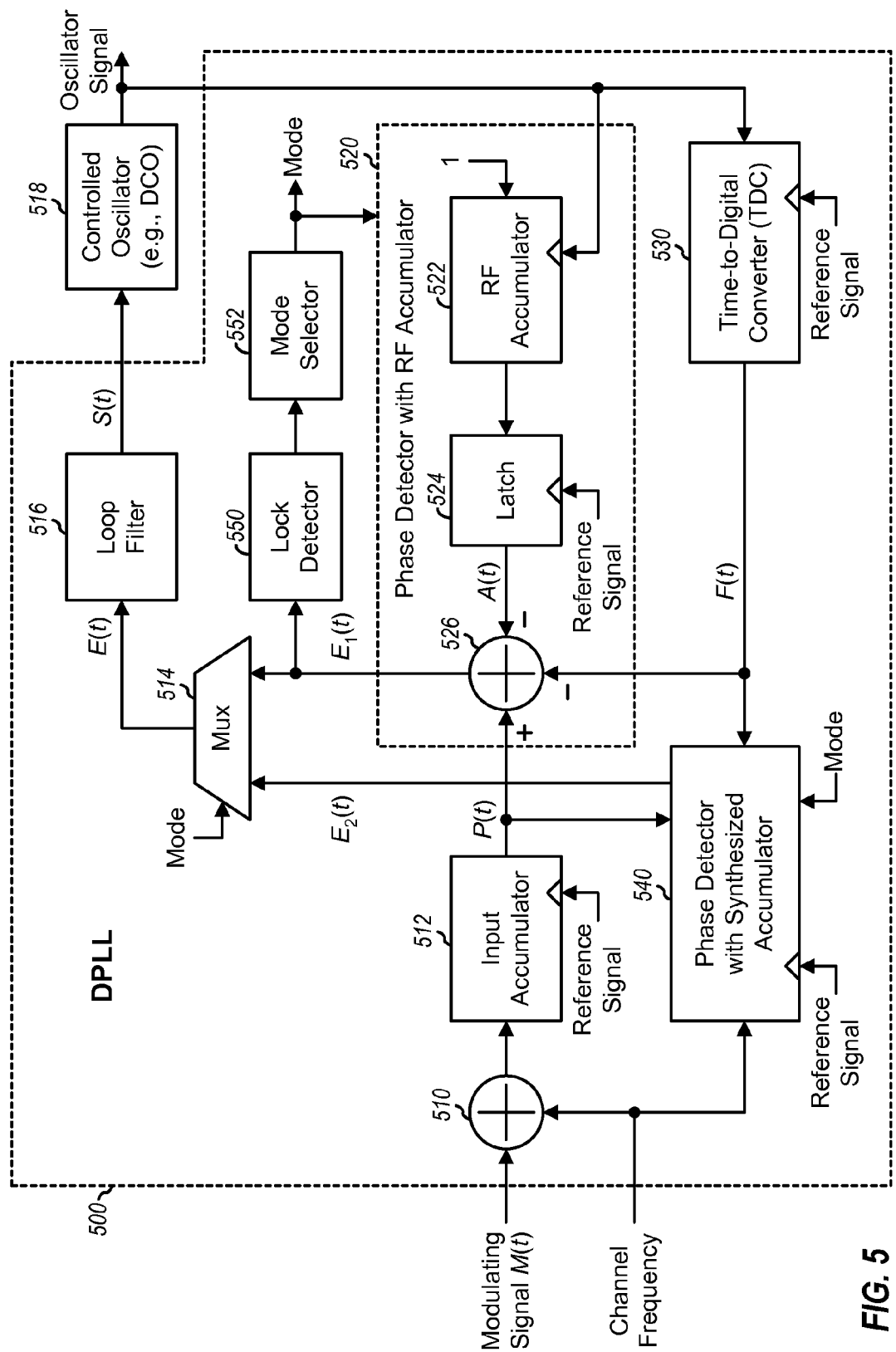
FIG. 5 shows a block diagram of a DPLL with a synthesized accumulator.

FIG. 5 shows a block diagram of a design of a DPLL 500 with a synthesized accumulator. Within DPLL 500, a summer 510 and an input accumulator 512 operate as described above for summer 110 and input accumulator 112 in FIG. 1 and provide an input phase P(t).

A TDC 530 receives an oscillator signal from a controlled oscillator 518 and a reference signal and provides a TDC output F(t) that indicates the phase difference between the oscillator signal and the reference signal. A phase detector 520 receives the oscillator signal, the TDC output, and the input phase and generates a first phase error $E_1(t)$. Phase detector 520 includes an RF accumulator 522, a latch 524, and a summer 526 that operate as described above for RF accumulator 122, latch 124, and summers 114 and 126 in FIG. 1. Phase detector 520 may be enabled or disabled by a mode signal. A phase detector 540 receives the channel frequency, the reference signal, the TDC output, and the input phase and generates a second phase error $E_2(t)$. Phase detector 540 includes a synthesized accumulator and may be implemented as described below. Phase detector 540 may be enabled or disabled by the mode signal. Either phase detector 520 or 540 may be enabled at any given moment, and the other phase detector may be disabled to conserve battery power.

A multiplexer (Mux) 514 receives the two phase errors $E_1(t)$ and $E_2(t)$ from phase detectors 520 and 540, respectively, and the mode signal and provides a phase error E(t). Multiplexer 514 provides the first phase error $E_1(t)$ as the phase error E(t) when phase detector 520 is enabled and provides the second phase error $E_2(t)$ as the phase error E(t) when phase detector 540 is enabled. A loop filter 516 filters the phase error E(t) and provides a control signal S(t) for oscillator 518.

In one design, phase detector 520 may be enabled initially and used to lock oscillator 518 to the modulating signal. After DPLL 500 has locked, phase detector 520 may be disabled, and phase detector 540 may be enabled. A lock detector 550 receives the first phase error $E_1(t)$ from phase detector 520 and determines whether DPLL 500 has locked. This may be achieved by observing the magnitude of the first phase error $E_1(t)$, which may be large initially when DPLL 500 is not locked and may be small when DPLL 500 is locked. Lock detector 550 provides a lock indicator that may be set to one logic value (e.g., '1') when DPLL is locked or to the other logic value (e.g., '0') when DPLL is not locked. A mode selector 552 receives the lock indicator and possibly other inputs not shown in FIG. 5 and provides the mode signal. For example, mode selector 552 may enable phase detector 540 and disable phase detector 520 as soon as DPLL is locked or at a later time. Both phase detectors 520 and 540 may be enabled concurrently for a period of time before switching off RF accumulator 522. Mode selector 552 may also re-enable phase detector 520 whenever loss of lock is detected (e.g., due to a fatal disturbance to DPLL 500) or for any other reason. Lock detector 550 and mode selector 552 may also be used for DPLL 300 in FIG. 3 to generate the phase error with the output of an RF accumulator (not shown in FIG. 3) when the DPLL is not locked.

Figure 6:
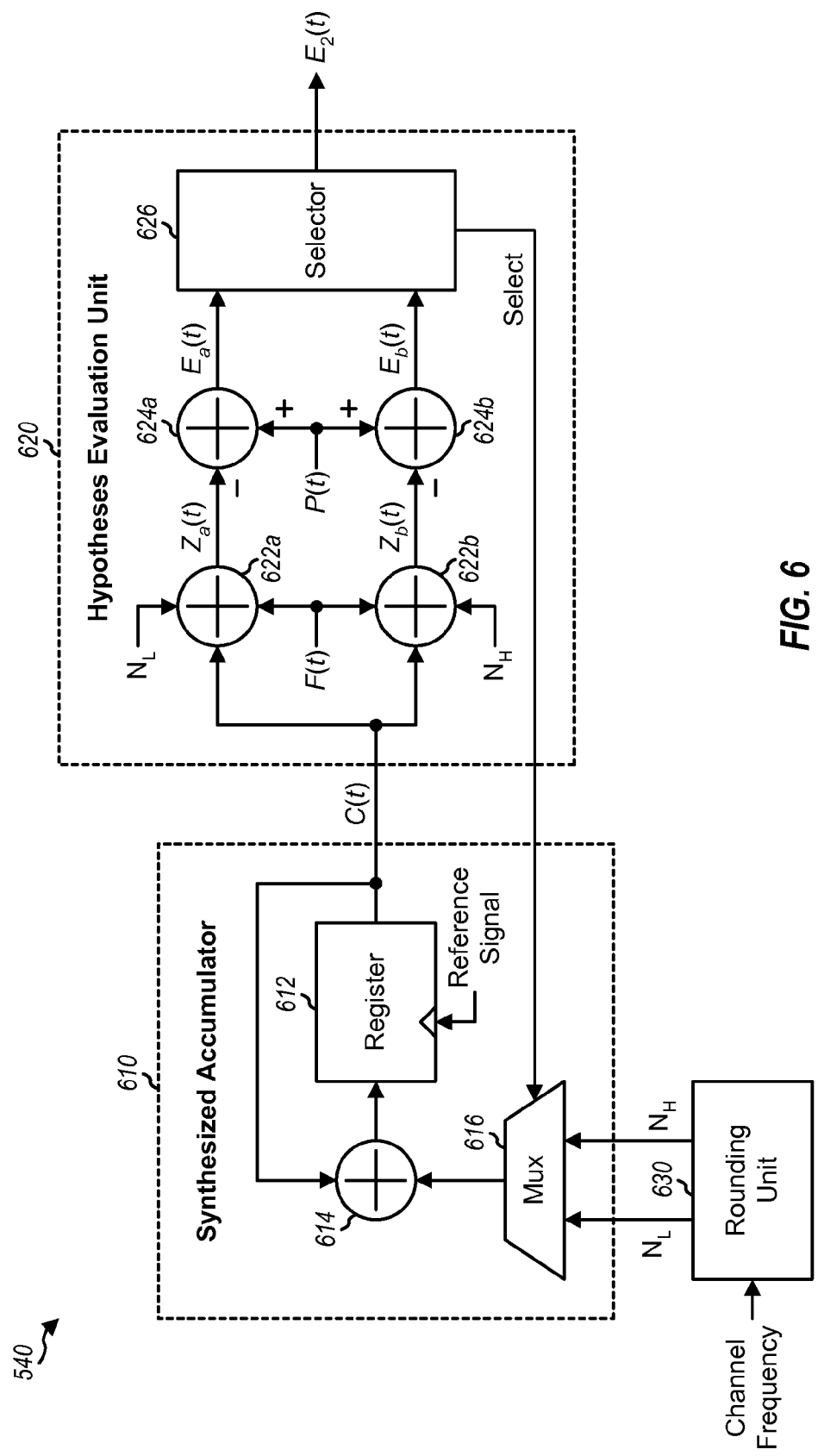
FIG. 6 shows a block diagram of a phase detector with a synthesized accumulator.

FIG. 6 shows a block diagram of a design of phase detector 540 in FIG. 5. In this design, phase detector 540 includes a synthesized accumulator 610, a hypotheses evaluation unit 620, and a rounding unit 630. Rounding unit 630 may receive the channel frequency and determine the two possible integer values for N(t), which are $N_L$ and $N_H$. Alternatively, unit 630 may receive the coarse output phase A(t) from latch 524 in FIG. 5. When phase detector 520 is enabled and DPLL 500 is locked, the coarse output phase A(t) should toggle between $N_L$ and $N_H$. Hence, unit 630 may determine $N_L$ and $N_H$ based on the values of the coarse output phase A(t) after DPLL 500 has locked.

Synthesized accumulator 610 keeps track of the number of oscillator cycles but operates based on the reference signal instead of the oscillator signal, which may greatly reduce power consumption for DPLL 500. Synthesized accumulator 610 includes a register 612, a summer 614, and a multiplexer

616. Register 612 stores the current coarse output phase C(t) in integer number of oscillator cycles. Multiplexer 616 receives $N_L$ and $N_H$ and a select signal that indicates which hypothesis is the correct/winning hypothesis. In each reference cycle, multiplexer 616 provides $N_L$ if hypothesis a is the correct hypothesis and provides $N_H$ if hypothesis b is the correct hypothesis. Summer 614 sums the current coarse output phase C(t) from register 612 and the output of multiplexer 616 and provides an updated coarse output phase C(t+1), which is stored in register 612. Register 612, summer 614, and multiplexer 616 implement equation (11).

Unit 620 evaluates the two hypotheses a and b in each reference cycle and provides the phase error $E_2(t)$ as well as the select signal indicating the correct hypothesis. Within unit 620, a summer 622a receives and sums the coarse output phase C(t) from register 612, the TDC output F(t), and $N_L$ and provides the hypothesized output phase $Z_a(t)$ for hypothesis a, as shown in equation (7). A summer 624a subtracts the hypothesized output phase $Z_a(t)$ from the input phase P(t) and provides the hypothesized phase error $E_a(t)$ for hypothesis a, as shown in equation (9). Similarly, a summer 622b receives and sums the coarse output phase C(t), the TDC output F(t), and $N_H$ and provides the hypothesized output phase $Z_b(t)$ for hypothesis b, as shown in equation (8). A summer 624b subtracts the hypothesized output phase $Z_b(t)$ from the input phase P(t) and provides the hypothesized phase error $E_b(t)$ for hypothesis b, as shown in equation (10).

A selector 626 receives the hypothesized phase errors $E_a(t)$ and $E_b(t)$ for the two hypotheses and determines the smaller magnitude of the two hypothesized phase errors. Selector 626 provides the hypothesized phase error with the smaller magnitude as the phase error $E_2(t)$ from phase detector 540, as shown in equation (12). Selector 626 also provides the select signal, which indicates the correct hypothesis that produces the smaller hypothesized phase error magnitude.

FIGS. 4 and 6 show a design in which the RF accumulator output is rounded down, e.g., from 3.25 down to 3, from 6.5 down to 6, etc. In this case, the TDC output F(t) is added to the coarse output phase C(t) for each hypothesis. In another design, the RF accumulator output is rounded up, e.g., from 3.25 up to 4, from 6.5 up to 7, etc. In this case, the TDC output F(t) is subtracted from the coarse output phase C(t) for each hypothesis (not shown in FIG. 4 or 6). In general, the hypotheses may be evaluated in a manner consistent with how the synthesized accumulator is updated.

FIG. 6 shows an example design of synthesized accumulator 610 and hypotheses evaluation unit 620 for a case in which two integer values $N_L$ and $N_H$ are possible during normal operation of DPLL 500. N(t) may have more than two possible integer values, e.g., for wideband modulation or when DPLL 500 is first powered up. A large frequency difference due to wideband modulation may be compensated by applying a correction factor to the coarse output phase from the synthesized accumulator. In general, one hypothesis may be evaluated for each possible integer value of N(t). The hypothesis with the smallest phase error may be selected, and the synthesized accumulator may be updated based on the N(t) value for the selected hypothesis.

In one design, a DPLL includes both an RF accumulator operating at the oscillator frequency and a synthesized accumulator operating at the reference frequency, e.g., as shown in FIG. 5. The RF accumulator may be used at the start of operation, and the synthesized accumulator may be used during normal operation after the DPLL has locked, as described above for FIG. 5.

In another design, a DPLL includes only a synthesized accumulator operating at the reference frequency. At the start of operation, more (e.g., three, four, or maybe more) hypotheses may be evaluated for more possible values of N(t). After the DPLL has locked, fewer (e.g., two) hypotheses may be evaluated for fewer possible N(t) values. Alternatively, the same number of hypotheses (e.g., two hypotheses) may be evaluated both at the start of operation and during normal operation. The loop bandwidth may be selected to achieve the desired acquisition performance for the DPLL with the limited number of possible N(t) values.

DPLL 500 in FIG. 5 may operate in an equivalent manner to DPLL 300 in FIG. 3. When DPLL 500 is locked, the integer portion of the hypothesized phase, which is the coarse output phase C(t) from synthesized accumulator 610 of FIG. 6, should match the integer portion of the input phase. These two integer portions would be canceled by summers 624a and 624b in FIG. 6, and only the difference between the fractional portions would be provided in the phase error $E_2(t)$.

Figure 7:
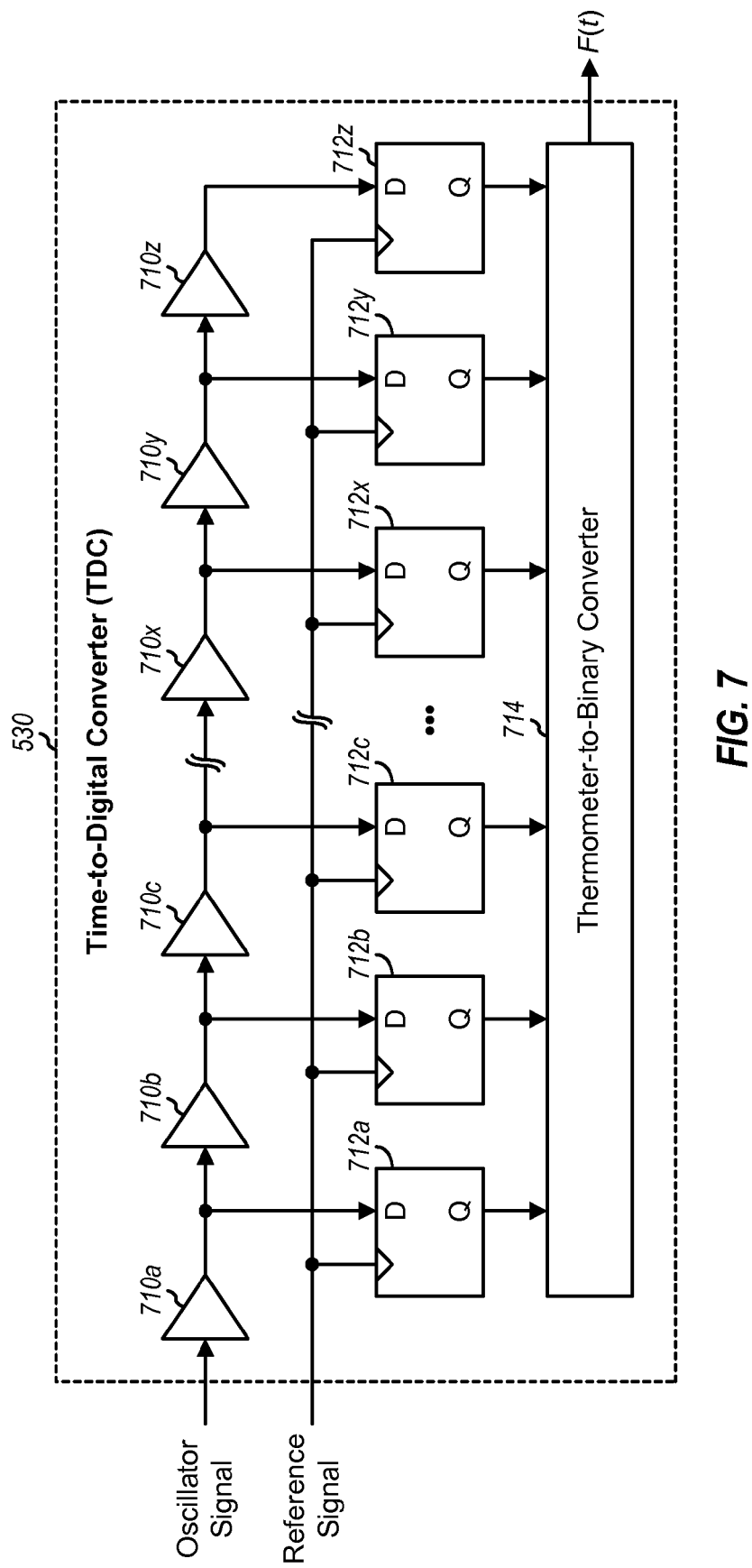
FIG. 7 shows a schematic diagram of the TDC.

FIG. 7 shows a schematic diagram of a design of TDC 530 in FIG. 5. TDC 530 compares the phase of the oscillator signal against the phase of the reference signal and provides the detected phase difference with multiple (B) bits of resolution.

TDC 530 includes $2^B$ delay elements 710a through 710z, $2^B$ D flip-flops 712a through 712z, and a thermometer-to-binary converter 714. Delay elements 710a through 710z are coupled in series, with delay element 710a receiving the oscillator signal. Each delay element 710 may be implemented with inverters and/or other types of logic elements to obtain the desired delay resolution. Delay elements 710a through 710z provide a total delay of approximately one oscillator cycle. For example, if the oscillator frequency $f_{osc}$ is 4 GHz, then one oscillator cycle is 250 picoseconds (ps), and each delay element 710 provides a delay of approximately $250/2^B$ ps.

D flip-flops 712a through 712z have their D inputs coupled to the outputs of delay elements 710a through 710z, respectively, and their clock inputs receiving the reference signal. Each D flip-flop 712 samples the output signal from an associated delay element 710 and provides the sampled output to converter 714. The number of D flip-flops at logic high versus the number of D flip-flops at logic low is indicative of the phase difference between the oscillator signal and the reference signal. This phase difference has a resolution of $\frac{1}{2}^B$ oscillator cycle. Converter 714 receives the $2^B$ outputs from D flip-flops 712a through 712z, converts these $2^B$ outputs to a B-bit binary value, and provides the B-bit binary value as the fine/fractional output phase.

In general, TDC 530 may be designed with any number of bits of resolution. For example, B may be 8 or more depending on the desired delay resolution, the minimum delay available in an integrated circuit (IC) process, etc. The desired delay resolution may be dependent on the application for which DPLL 500 is used.

A DPLL may be used for various applications. For example, the DPLL may be used for a frequency synthesizer to generate an oscillator signal at a desired frequency. In this case, the modulating signal M(t) may be omitted or set to zero. The DPLL may also be used for a polar modulator, a quadrature modulator, a phase modulator, a frequency modulator, a demodulator, etc. For a modulator, the bandwidth of the modulating signal may be larger than the closed-loop bandwidth of the DPLL. The DPLL may be design to accommodate the wide bandwidth of the modulating signal.

Figure 8:
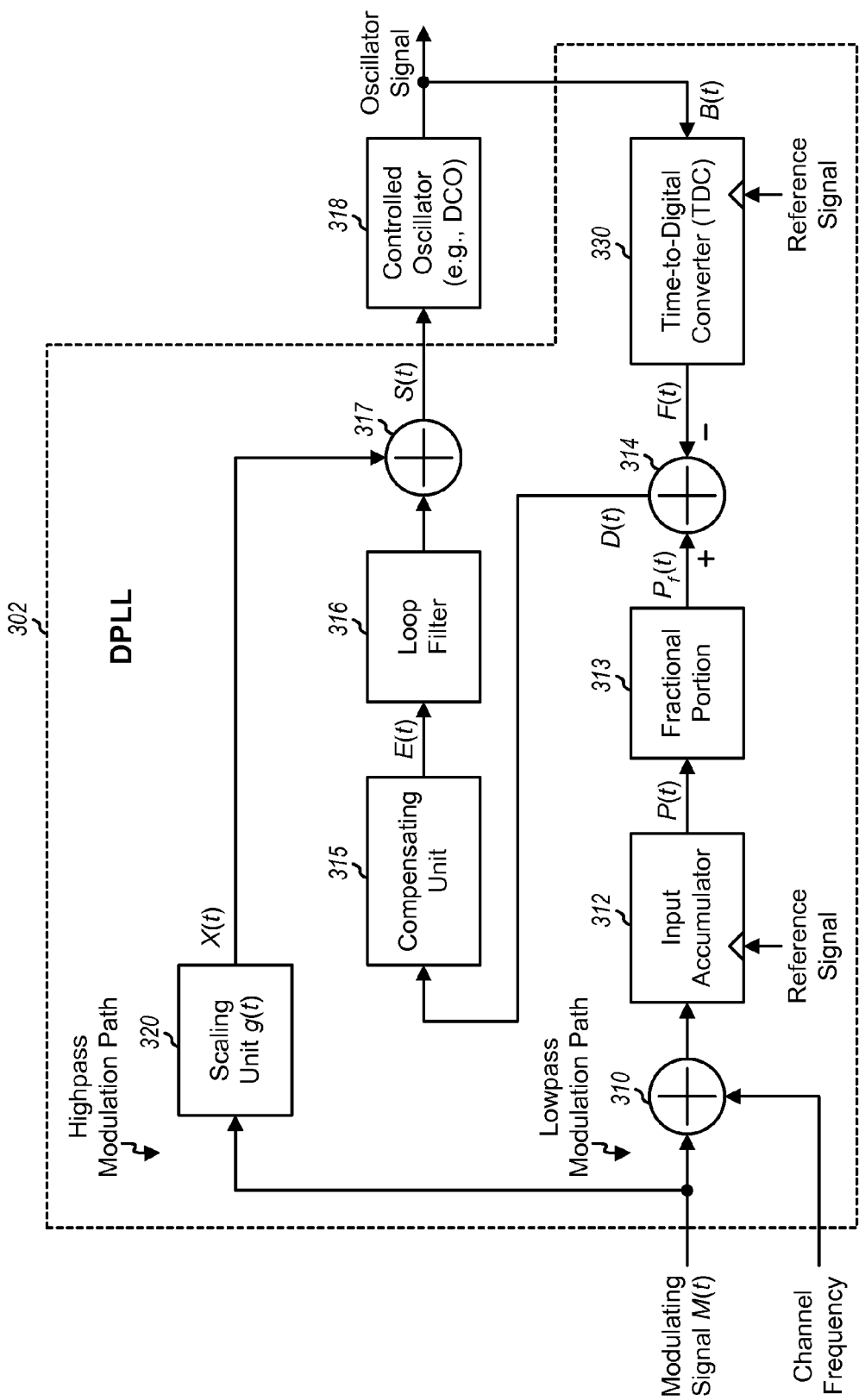
FIG. 8 shows a block diagram of another DPLL supporting wideband modulation.

FIG. 8 shows a block diagram of a design of a DPLL 302 supporting wideband modulation. DPLL 302 includes all of the blocks in DPLL 300 in FIG. 3. DPLL 302 further includes a scaling unit 320 and a summer 317.

DPLL 302 implements two-point or dual-port modulation in order to achieve high bandwidth modulation. The modulating signal M(t) may be provided to both a lowpass modulation path and a highpass modulation path. In the lowpass modulation path, summer 310 and input accumulator 312 operate on the modulating signal M(t) and provide the input phase P(t). The accumulation by input accumulator 312 essentially converts frequency to phase. In the highpass modulation path, scaling unit 320 receives and scales the modulating signal M(t) with a gain g(t) and provides a second modulating signal X(t). Summer 317 is coupled between the output of loop filter 316 and the input of oscillator 318. Summer 317 sums a filtered phase error signal from loop filter 316 and the second modulating signal X(t) from scaling unit 320 and provides the control signal S(t) for oscillator 318.

The bandwidth of the modulating signal may be determined by the application for which DPLL 302 is used and may be wider than the closed-loop bandwidth of the DPLL. The bandwidth of the lowpass modulation path in DPLL 302 is determined by loop filter 316 and may be relatively narrow (e.g., less than 100 KHz) in order to achieve the desired noise filtering and loop dynamics. By applying the modulating signal M(t) via separate highpass and lowpass modulation paths, DPLL 302 can modulate oscillator 318 with a wider signal bandwidth than the closed-loop bandwidth of the DPLL.

For simplicity, FIGS. 3, 5 and 8 show functional blocks of DPLLs 300, 500 and 502, respectively. Certain details are omitted for clarity. For example, delays may be inserted at appropriate locations within DPLLs 300, 302 and 500 in order to properly time align the various signals within these DPLLs.

FIGS. 3, 5 and 8 show some example designs of a modulating DPLL. A modulating DPLL may also be implemented with other designs, some of which are described in U.S. Pat. No. 6,909,331, entitled "PHASE LOCKED LOOP HAVING A FORWARD GAIN ADAPTATION MODULE," issued Jun. 21, 2005. The gain g(t) for the highpass modulation path may be determined as described in U.S. Pat. No. 6,909,331.

For DPLLs 300, 500 and 302 in FIGS. 3, 5 and 8, respectively, continuity in the output phase may be upset by a disturbance to the oscillator. Such a disturbance may originate from glitches in the power supply, spurious coupling from other loops, etc. In general, disturbances are not troublesome if the magnitude of the peak output phase shift per reference cycle is less than one half reference cycle, which will normally be the case. Hence, these DPLLs may be able to provide robust performance.

Figure 9:
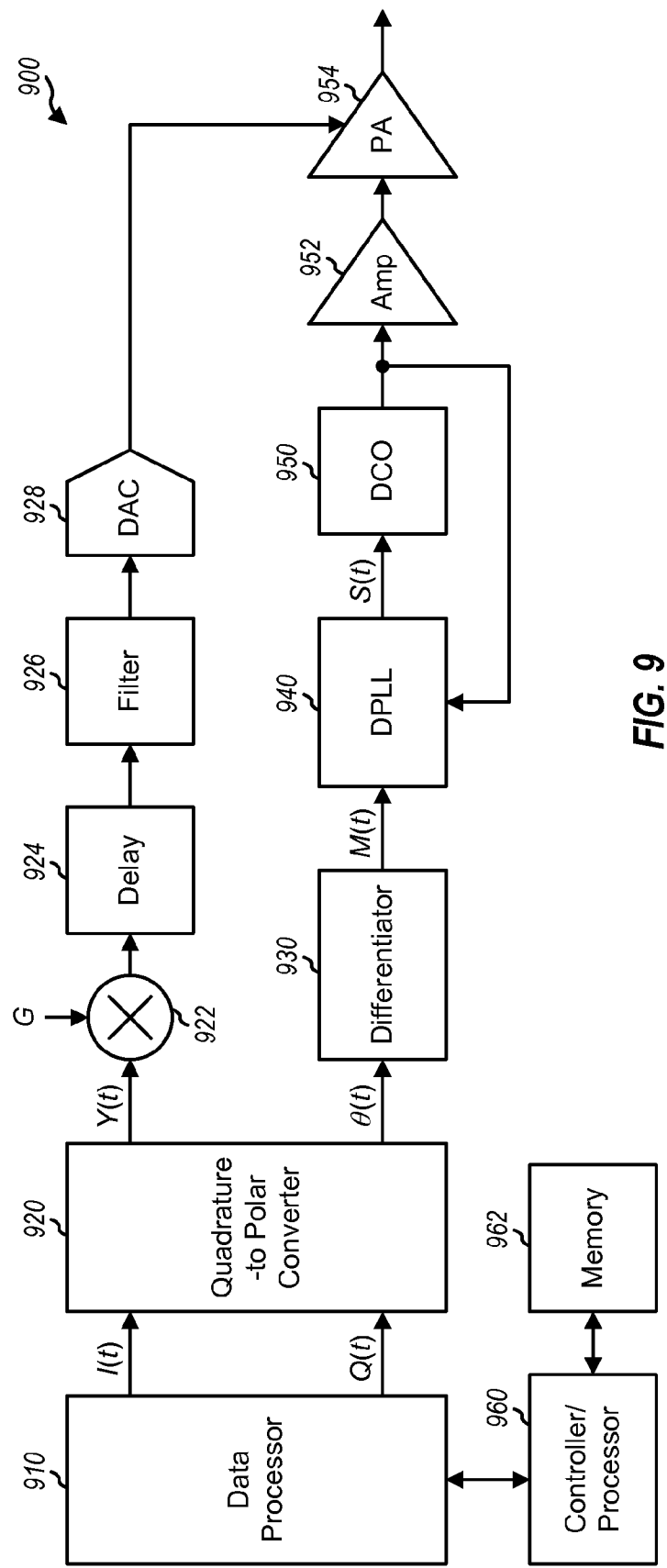
FIG. 9 shows a block diagram of a communication device.

FIG. 9 shows a block diagram of a design of a communication device 900 that employs a DPLL described herein. Device 900 may be used in a wireless communication device, a cellular phone, a personal digital assistant (PDA), a handheld device, a wireless modem, a cordless phone, a wireless station, a Bluetooth device, etc. Device 900 may also be used for various wireless communication systems such as Code Division Multiple Access (CDMA) systems, Time Division Multiple Access (TDMA) systems, Frequency Division Multiple Access (FDMA) systems, Orthogonal FDMA (OFDMA) systems, wireless local area networks (WLANs), etc. Device 900 may support a CDMA radio technology such as cdma2000, Wideband-CDMA (W-CDMA), etc. Device 900 may also support a TDMA radio technology such as Global System for Mobile Communications (GSM). These various systems and radio technologies are known in the art.

Within device 900, a data processor 910 may process (e.g., encode and modulate) data to obtain symbols. Processor 910 may also perform other processing (e.g., spreading, scrambling, etc.) on the symbols in accordance with a radio technology used for communication to obtain complex-valued samples. Processor 910 may provide an inphase data signal I(t) comprising the real part of each complex-valued sample and a quadrature data signal Q(t) comprising the imaginary part of each complex-valued sample. A quadrature-to-polar converter 920 may receive the I(t) and Q(t) data signals, convert each complex-valued sample from Cartesian to polar coordinates, and provide an envelope signal Y(t) and a phase signal θ(t).

In the envelope path, a multiplier 922 may multiply the envelope signal with a gain G to obtain a desired output power level. A delay unit 924 may provide a programmable amount of delay to time align the envelope signal and the phase signal. A filter 926 may filter the delayed envelope signal with a suitable filter response. A digital-to-analog converter (DAC) 928 may convert the filtered envelope signal to analog and provide an output envelope signal. The gain of a power amplifier (PA) 954 may be varied by the output envelope signal to achieve amplitude modulation.

In the phase path, a differentiator 930 may differentiate the phase signal θ(t) and provide a modulating signal M(t), which may contain the frequency component of the I(t) and Q(t) data signals. A DPLL 940 may receive the modulating signal M(t) and generate a control signal S(t) for a DCO 950. DPLL 940 may be implemented with DPLL 300 in FIG. 3, DPLL 500 in FIG. 5, or DPLL 302 in FIG. 8. DCO 950 may generate a phase modulated signal that is modulated by the modulating signal. An amplifier (Amp) 952 may amplify the phase modulated signal. PA 954 may further amplify the output of amplifier 952 based on the output envelope signal and provide an RF output signal that is both phase and amplitude modulated.

A controller/processor 960 may control the operation of data processor 910 and other blocks within device 900. A memory 962 may store data and program codes for controller/processor 960 and/or other blocks.

Various blocks in device 900 may be implemented digitally. For example, processor 910 through filter 926, differentiator 930, DPLL 940, and controller/processor 960 may be implemented with one or more digital signal processors (DSPs), reduced instruction set computer (RISC) processors, central processing units (CPUs), etc. The digital blocks may be implemented on one or more application specific integrated circuits (ASICs) and/or other integrated circuits (ICs). The remaining blocks in device 900 may be implemented with analog circuits. Part of DCO 950, amplifier 952, and/or PA 954 may be implemented on one or more RF ICs (RFICs), analog ICs, mixed-signal ICs, etc.

Figures 10, 11:
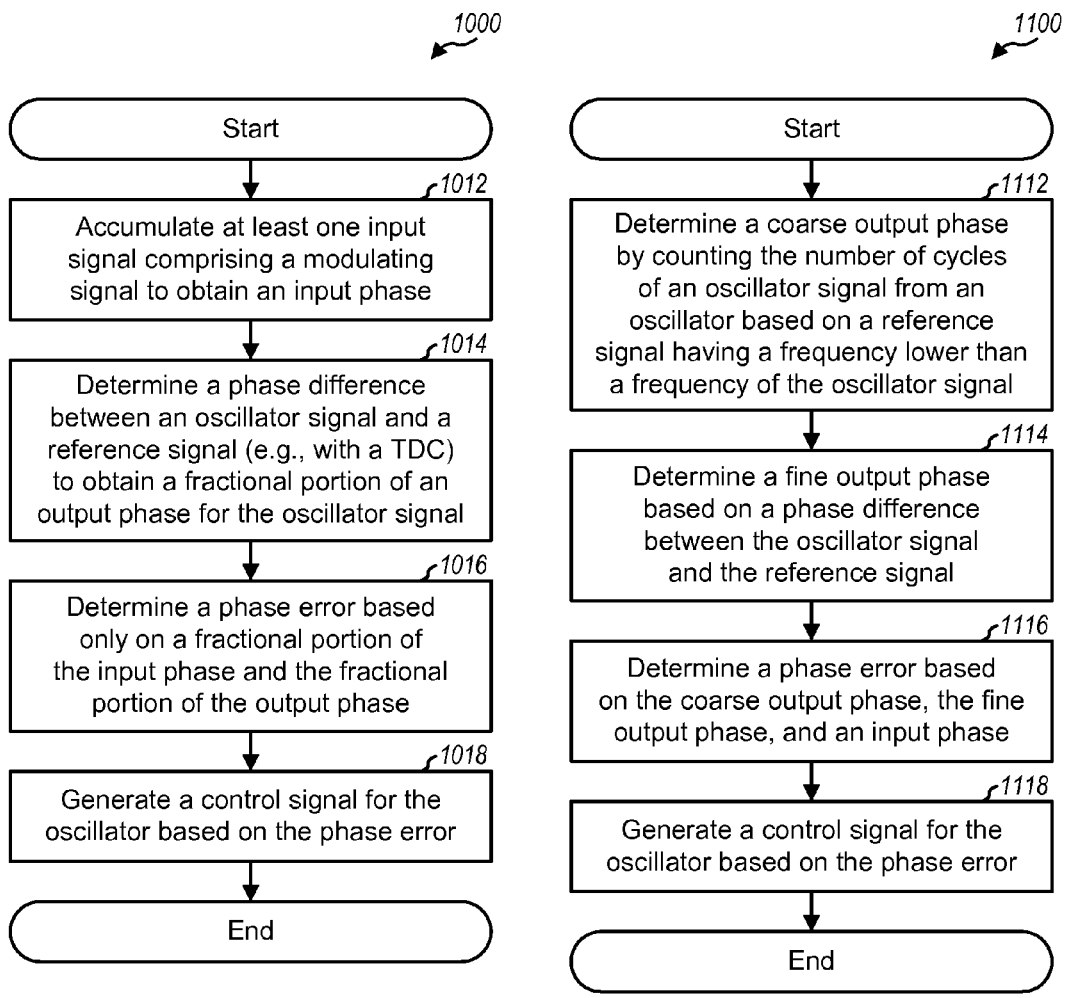
FIG. 10 shows a process for controlling an oscillator.
FIG. 11 shows another process for controlling an oscillator.

FIG. 10 shows a design of a process 1000 for controlling an oscillator, e.g., a DCO, a VCO, etc. At least one input signal, which may include a modulating signal, may be accumulated to obtain an input phase (block 1012). A phase difference between an oscillator signal and a reference signal may be determined (e.g., with a TDC) to obtain a fractional portion of an output phase for the oscillator signal (block 1014).

A phase error may be determined based only on a fractional portion of the input phase and the fractional portion of the output phase (block 1016). The fractional portion may have a range of one cycle of the oscillator signal. For block 1016, a phase difference between the fractional portion of the output phase and the fractional portion of the input phase may be determined. A predetermined value (e.g., one oscillator cycle) may be added to the phase difference if it is less than a first value, e.g., minus one half oscillator cycle. The predetermined value may be subtracted from the phase difference if it is greater than a second value, e.g., plus one half oscillator cycle. The phase difference after adding or subtracting the predetermined value, if any, may be provided as the phase error. A control signal for the oscillator may be generated based on the phase error (block 1018).

An integer portion of the output phase may be determined by keeping track of the number of cycles of the oscillator signal (e.g., with an RF accumulator). The phase error may be determined based on the integer and fractional portions of the input phase and the integer and fractional portions of the output phase when not locked. The phase error may be determined based only on the fractional portion of the input phase and the fractional portion of the output phase when locked.

FIG. 11 shows a design of a process 1100 for controlling an oscillator, e.g., a DCO, a VCO, etc. A coarse output phase C(t) may be determined (e.g., with a synthesized accumulator) by keeping track of the number of cycles of an oscillator signal from the oscillator based on a reference signal having a frequency lower than a frequency of the oscillator signal (block 1112). A fine output phase F(t) may be determined based on a phase difference between the oscillator signal and the reference signal, e.g., with a TDC (block 1114). A phase error E(t) may be determined based on the coarse output phase, the fine output phase, and an input phase P(t) (block 1116). A control signal S(t) for the oscillator may be generated based on the phase error (block 1118).

For block 1112, the coarse output phase may be updated by either a first integer value $N_L$ or a second integer value $N_H$ in each update interval, e.g., each reference cycle. The first and second integer values may be consecutive integer values determined based on the frequency of the oscillator signal and the frequency of the reference signal, e.g., as shown in equation (6). Two hypotheses may be evaluated for the first and second integer values in each update interval based on the first and second integer values, the coarse output phase, the fine output phase, and the input phase. The coarse output phase may be updated by the first or second integer value based on the results of the evaluation of the two hypotheses. For example, a first hypothesized output phase $Z_a(t)$ may be determined based on the first integer value, the coarse output phase, and the fine output phase. A second hypothesized output phase $Z_b(t)$ may be determined based on the second integer value, the coarse output phase, and the fine output phase. The coarse output phase may be updated by (i) the first integer value if the first hypothesized output phase is closer to the input phase than the second hypothesized output phase or (ii) the second integer value otherwise.

The coarse output phase A(t) may be determined by keeping tracking of the number of cycles of the oscillator signal based on the oscillator signal in a first time duration, e.g., at the start of operation. The coarse output phase C(t) may be determined by keeping tracking of the number of cycles of the oscillator signal based on the reference signal in a second time duration, e.g., after lock has been achieved.

The DPLL described herein may be implemented by various means. For example, the DPLL may be implemented in hardware, firmware, software, or a combination thereof. For a hardware implementation, the blocks within the DPLL may be implemented with one or more DSPs, digital signal processing devices (DSPDs), programmable logic devices (PLDs), field programmable gate arrays (FPGAs), processors, controllers, micro-controllers, microprocessors, electronic devices, other electronic units or digital circuitry designed to perform the functions described herein, a computer, or a combination thereof.

The DPLL may also be implemented on an IC, an analog IC, a digital IC, an RFIC, a mixed-signal IC, an ASIC, a printed circuit board (PCB), an electronics device, etc. The DPLL may also be fabricated with various IC process technologies such as complementary metal oxide semiconductor (CMOS), N-channel MOS (N-MOS), P-channel MOS (P-MOS), bipolar junction transistor (BJT), bipolar-CMOS (BiCMOS), silicon germanium (SiGe), gallium arsenide (GaAs), etc.

For a firmware and/or software implementation, the blocks within the DPLL may be implemented with code (e.g., procedures, functions, modules, instructions, etc.) that performs the functions described herein. In general, any computer/processor-readable medium tangibly embodying firmware and/or software code may be used in implementing the techniques described herein. For example, the firmware and/or software code may be stored in a memory (e.g., memory 962 in FIG. 9) and executed by a processor (e.g., processor 960). The memory may be implemented within the processor or external to the processor. The firmware and/or software code may also be stored in a computer/processor-readable medium such as random access memory (RAM), read-only memory (ROM), non-volatile random access memory (NVRAM), programmable read-only memory (PROM), electrically erasable PROM (EEPROM), FLASH memory, floppy disk, compact disc (CD), digital versatile disc (DVD), magnetic or optical data storage device, etc. The code may be executable by one or more computers/processors and may cause the computer/processor(s) to perform certain aspects of the functionality described herein.

An apparatus implementing the DPLL described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   an oscillator configured to generate an oscillator signal; and
   a digital phase-locked loop (DPLL) configured to receive the oscillator signal from the oscillator, to determine a phase error based only on a fractional portion of an input phase and a fractional portion of an output phase, and to generate a control signal for the oscillator based on the phase error.

2. The apparatus of claim 1, wherein the fractional portion of the input phase and the fractional portion of the output phase each has a range of one cycle of the oscillator signal.

3. The apparatus of claim 1, wherein the DPLL comprises a time-to-digital converter (TDC) configured to determine a phase difference between the oscillator signal and a reference signal, and to provide the phase difference as the fractional portion of the output phase.

4. The apparatus of claim 1, wherein the DPLL comprises
   an accumulator configured to accumulate at least one input signal to obtain the input phase, and
   a unit configured to receive the input phase and provide the fractional portion of the input phase.

5. The apparatus of claim 4, wherein the at least one input signal comprises a modulating signal.

6. The apparatus of claim 1, wherein the DPLL is configured to determine a phase difference between the fractional portion of the output phase and the fractional portion of the input phase, to add a predetermined value to the phase difference if the phase difference is less than a first value, to subtract the predetermined value from the phase difference if the phase difference is greater than a second value, and to provide the phase difference after adding or subtracting the predetermined value, if any, as the phase error.

7. The apparatus of claim 6, wherein the predetermined value corresponds to one cycle of the oscillator signal, and wherein the first value corresponds to minus one half cycle and the second value corresponds to plus one half cycle of the oscillator signal.

8. The apparatus of claim 1, wherein the DPLL comprises
a radio frequency (RF) accumulator configured to determine an integer portion of the output phase by keeping track of a number of cycles of the oscillator signal, and
wherein the DPLL is configured to determine the phase error based on an integer portion and the fractional portion of the input phase and the integer and fractional portions of the output phase when the DPLL is not locked, and to determine the phase error based only on the fractional portion of the input phase and the fractional portion of the output phase when the DPLL is locked.

9. A method comprising:
determining a phase error based only on a fractional portion of an input phase and a fractional portion of an output phase for an oscillator signal from an oscillator; and
generating a control signal for the oscillator based on the phase error, wherein the fractional portion of the input phase and the fractional portion of the output phase each has a range of one cycle of the oscillator signal.

10. The method of claim 9, further comprising:
determining the fractional portion of the output phase based on a phase difference between the oscillator signal and a reference signal.

11. The method of claim 9, wherein the determining the phase error comprises
determining a phase difference between the fractional portion of the output phase and the fractional portion of the input phase,
adding a predetermined value to the phase difference if the phase difference is less than a first value,
subtracting the predetermined value from the phase difference if the phase difference is greater than a second value, and
providing the phase difference after adding or subtracting the predetermined value, if any, as the phase error.

12. The method of claim 9, further comprising:
determining an integer portion of the output phase by keeping track of a number of cycles of the oscillator signal;
determining the phase error based on an integer portion and the fractional portion of the input phase and the integer and fractional portions of the output phase when not locked; and
determining the phase error based only on the fractional portion of the input phase and the fractional portion of the output phase when locked.

13. An apparatus comprising:
means for determining a phase error based only on a fractional portion of an input phase and a fractional portion of an output phase for an oscillator signal from an oscillator; and
means for generating a control signal for the oscillator based on the phase error, wherein the fractional portion of the input phase and the fractional portion of the output phase each has a range of one cycle of the oscillator signal.

14. The apparatus of claim 13, further comprising:
means for determining the fractional portion of the output phase based on a phase difference between the oscillator signal and a reference signal.

15. The apparatus of claim 13, wherein the means for determining the phase error comprises
means for determining a phase difference between the fractional portion of the output phase and the fractional portion of the input phase,
means for adding a predetermined value to the phase difference if the phase difference is less than a first value,
means for subtracting the predetermined value from the phase difference if the phase difference is greater than a second value, and
means for providing the phase difference after adding or subtracting the predetermined value, if any, as the phase error.

16. The apparatus of claim 13, further comprising:
means for determining an integer portion of the output phase by keeping track of a number of cycles of the oscillator signal;
means for determining the phase error based on an integer portion and the fractional portion of the input phase and the integer and fractional portions of the output phase when not locked; and
means for determining the phase error based only on the fractional portion of the input phase and the fractional portion of the output phase when locked.

17. A computer program product, comprising:
a non-transitory computer-readable medium comprising:
code for causing at least one computer to determine a phase error based only on a fractional portion of an input phase and a fractional portion of an output phase for an oscillator signal from an oscillator; and
code for causing the at least one computer to generate a control signal for the oscillator based on the phase error, wherein the fractional portion of the input phase and the fractional portion of the output phase each has a range of one cycle of the oscillator signal.

18. An apparatus comprising:
an oscillator configured to generate an oscillator signal; and
a digital phase-locked loop (DPLL) configured to receive the oscillator signal from the oscillator and a reference signal and to generate a control signal for the oscillator, the DPLL comprising a synthesized accumulator configured to determine a coarse output phase by keeping track of a number of cycles of the oscillator signal, the synthesized accumulator being updated based on the reference signal having a frequency lower than a frequency of the oscillator signal.

19. The apparatus of claim 18, wherein the synthesized accumulator is updated by a first integer value or a second integer value in each update interval, the first and second integer values being consecutive integer values determined by the frequency of the oscillator signal and the frequency of the reference signal.

20. The apparatus of claim 19, wherein the DPLL further comprises an evaluation unit configured to evaluate two hypotheses for the first and second integer values in each update interval, and to provide an indication to update the synthesized accumulator by the first or second integer value in each update interval based on results of the evaluation of the two hypotheses.

21. The apparatus of claim 20, wherein the DPLL further comprises a time-to-digital converter (TDC) configured to determine a fine output phase based on a phase difference between the oscillator signal and the reference signal, and wherein the evaluation unit is configured to evaluate the two hypotheses based on the first and second integer values, the coarse output phase, the fine output phase, and an input phase.

22. The apparatus of claim 21, wherein the evaluation unit is configured to determine a first hypothesized output phase based on the first integer value, the coarse output phase, and the fine output phase, to determine a second hypothesized output phase based on the second integer value, the coarse output phase, and the fine output phase, and to provide an indication to update the synthesized accumulator by the first integer value if the first hypothesized output phase is closer to the input phase than the second hypothesized output phase or by the second integer value otherwise.

23. The apparatus of claim 21, wherein the evaluation unit is configured to determine a first hypothesized phase error based on the first integer value, the coarse output phase, the fine output phase, and the input phase, to determine a second hypothesized phase error based on the second integer value, the coarse output phase, the fine output phase, and the input phase, and to provide an indication to update the synthesized accumulator by the first integer value if magnitude of the first hypothesized phase error is smaller than magnitude of the second hypothesized phase error or by the second integer value otherwise.

24. The apparatus of claim 18, wherein the DPLL further comprises
a radio frequency (RF) accumulator configured to determine the coarse output phase by keeping track of the number of cycles of the oscillator signal, the RF accumulator being operated based on the oscillator signal.

25. The apparatus of claim 24, wherein the RF accumulator is enabled for a first time duration and disable for a second time duration, and wherein the synthesized accumulator is enabled for the second time duration.

26. The apparatus of claim 24, wherein the DPLL further comprises a lock detector configured to determine whether the DPLL is locked, and wherein the RF accumulator is enabled when the DPLL is not locked and the synthesized accumulator is enabled after the DPLL has locked.

27. A method comprising:
determining a coarse output phase by keeping track of a number of cycles of an oscillator signal from an oscillator based on a reference signal having a frequency lower than a frequency of the oscillator signal, wherein the coarse output phase is determined by a synthesized accumulator;
determining a phase error based on the coarse output phase and an input phase; and
generating a control signal for the oscillator based on the phase error.

* * * * *